US007984352B2

(12) United States Patent
Greb

(10) Patent No.: US 7,984,352 B2
(45) Date of Patent: Jul. 19, 2011

(54) SAVING DEBUGGING CONTEXTS WITH PERIODIC BUILT-IN SELF-TEST EXECUTION

(75) Inventor: Karl F. Greb, Missouri City, TX (US)

(73) Assignee: Texas Instruments Incorporated, Dallas, TX (US)

( * ) Notice: Subject to any disclaimer, the term of this patent is extended or adjusted under 35 U.S.C. 154(b) by 260 days.

(21) Appl. No.: 12/347,825

(22) Filed: Dec. 31, 2008

(65) Prior Publication Data

US 2010/0088563 A1 Apr. 8, 2010

Related U.S. Application Data

(60) Provisional application No. 61/103,099, filed on Oct. 6, 2008.

(51) Int. Cl.
*G01R 31/28* (2006.01)
*G06F 11/00* (2006.01)
*G06F 9/455* (2006.01)
*G06F 9/00* (2006.01)

(52) U.S. Cl. ......... 714/733; 714/30; 714/724; 714/742; 714/E11.155; 714/E11.169; 714/E11.21; 716/112; 716/136; 712/227; 712/228

(58) Field of Classification Search .............. 714/30, 714/724, 733, 742, E11.155, E11.169, E11.21; 716/112, 136; 712/227, 228
See application file for complete search history.

(56) References Cited

U.S. PATENT DOCUMENTS

| | | | |
|---|---|---|---|
| 6,532,553 B1 * | 3/2003 | Gwilt et al. | 714/38 |
| 6,553,513 B1 * | 4/2003 | Swoboda et al. | 714/28 |
| 6,557,116 B1 * | 4/2003 | Swoboda et al. | 714/28 |
| 6,564,339 B1 * | 5/2003 | Swoboda et al. | 714/30 |
| 6,567,933 B1 * | 5/2003 | Swoboda et al. | 714/31 |
| 7,293,212 B2 * | 11/2007 | Blasco Allue et al. | 714/733 |
| 7,461,242 B2 * | 12/2008 | Grossman et al. | 712/228 |
| 2002/0065646 A1 * | 5/2002 | Waldie et al. | 703/26 |
| 2002/0133794 A1 * | 9/2002 | Kanapathippillai et al. | 716/4 |

* cited by examiner

*Primary Examiner* — John J Tabone, Jr.
(74) *Attorney, Agent, or Firm* — John R. Pessetto; W. James Brady; Frederick J. Telecky, Jr.

(57) ABSTRACT

A system comprises built-in self-test (BIST) logic configured to perform a BIST, processing logic coupled to the BIST logic and storage logic coupled to the processing logic. The storage logic comprises debug context information associated with a debugging session. Prior to performance of the BIST, the processing logic stores the debug context information to a destination. After performance of the BIST, the processing logic is reset, and the processing logic restores the debug context information from the destination to the storage logic.

2 Claims, 4 Drawing Sheets

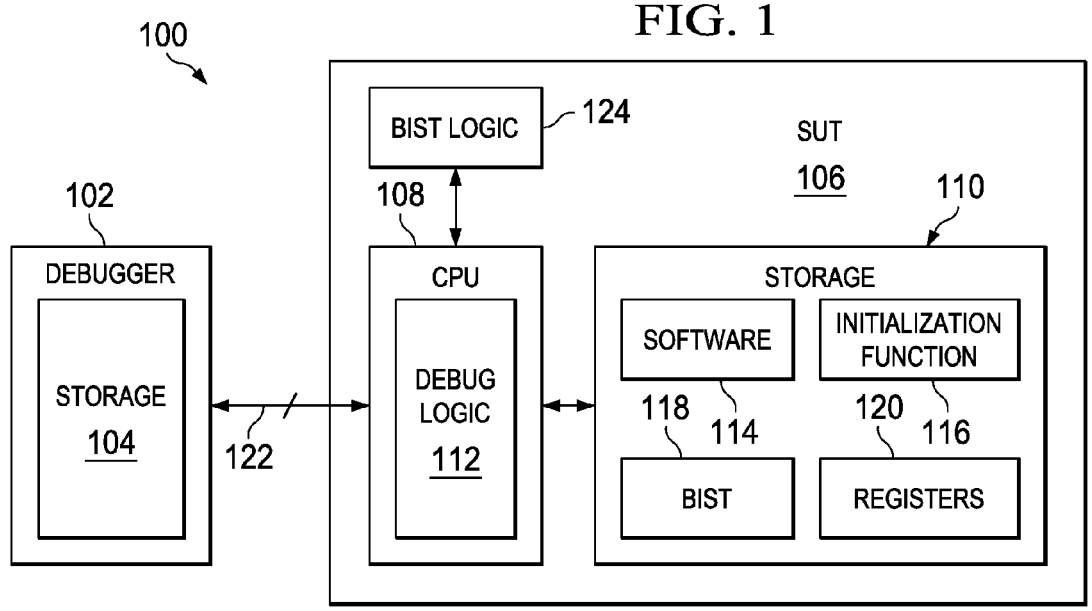
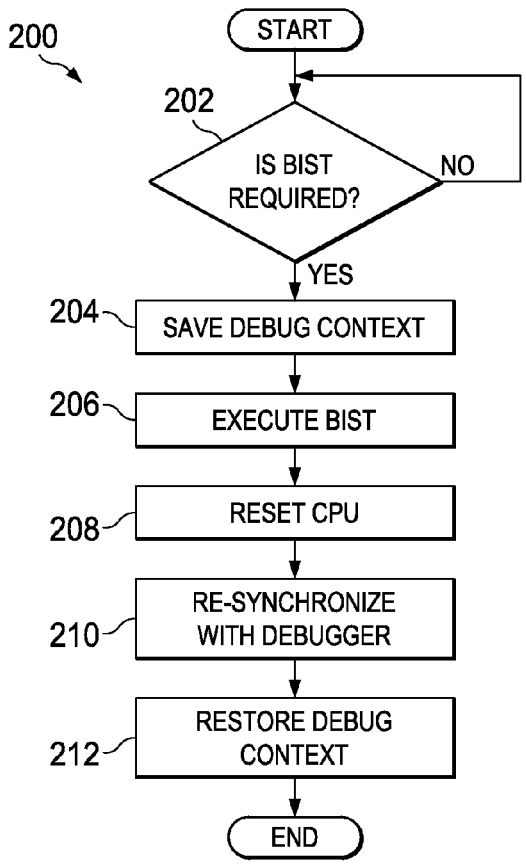

US 7,984,352 B2

SAVING DEBUGGING CONTEXTS WITH PERIODIC BUILT-IN SELF-TEST EXECUTION

CROSS-REFERENCE TO RELATED APPLICATIONS

This application claims the benefit of U.S. Provisional Application Ser. No. 61/103,099, filed Oct. 6, 2008, titled "Debug of Safety Applications with Periodic Logic BIST Execution," and incorporated herein by reference as if reproduced in full below.

BACKGROUND

Processors are often tested by executing built-in self-tests (BISTs). Executing a BIST while debugging an associated processor can be problematic because, when a BIST is executed, the processor loses its current state. Specifically, debug context information stored in the processor is lost. This loss of debug context information makes it difficult to properly restart the debugging process after a BIST is performed.

SUMMARY

The problems noted above are solved in large part by a technique for saving debugging contexts with periodic built-in self-test (BIST) execution. An illustrative embodiment includes a system that comprises processing logic and storage logic coupled to the processing logic. The system also comprises built-in self-test (BIST) logic. The storage comprises debug context information associated with a debugging session. Prior to performance of the BIST, the processing logic stores the debug context information to a destination. After performance of the BIST, the processing logic is reset, and the processing logic restores the debug context information from the destination to the storage logic.

Another illustrative embodiment includes a system under test (SUT) that executes a built-in self-test (BIST) during an SUT-debug session without losing debug context information associated with the debug session Yet another illustrative embodiment includes a method that comprises processing logic generating debug context information while debugging a system. The method also comprises, prior to execution of a built-in self-test (BIST), the processing logic saving the debug context information from a source storage to a destination storage. The method further comprises executing the BIST; resetting the processing logic; and the processing logic restoring the debug context information to the source storage.

BRIEF DESCRIPTION OF THE DRAWINGS

For a detailed description of exemplary embodiments of the invention, reference will now be made to the accompanying drawings in which:

FIG. 1 shows a block diagram of an illustrative system implementing the techniques disclosed herein, in accordance with embodiments;

FIG. 2 shows a flow diagram of a method implemented in accordance with various embodiments;

NOTATION AND NOMENCLATURE

Figure 3:
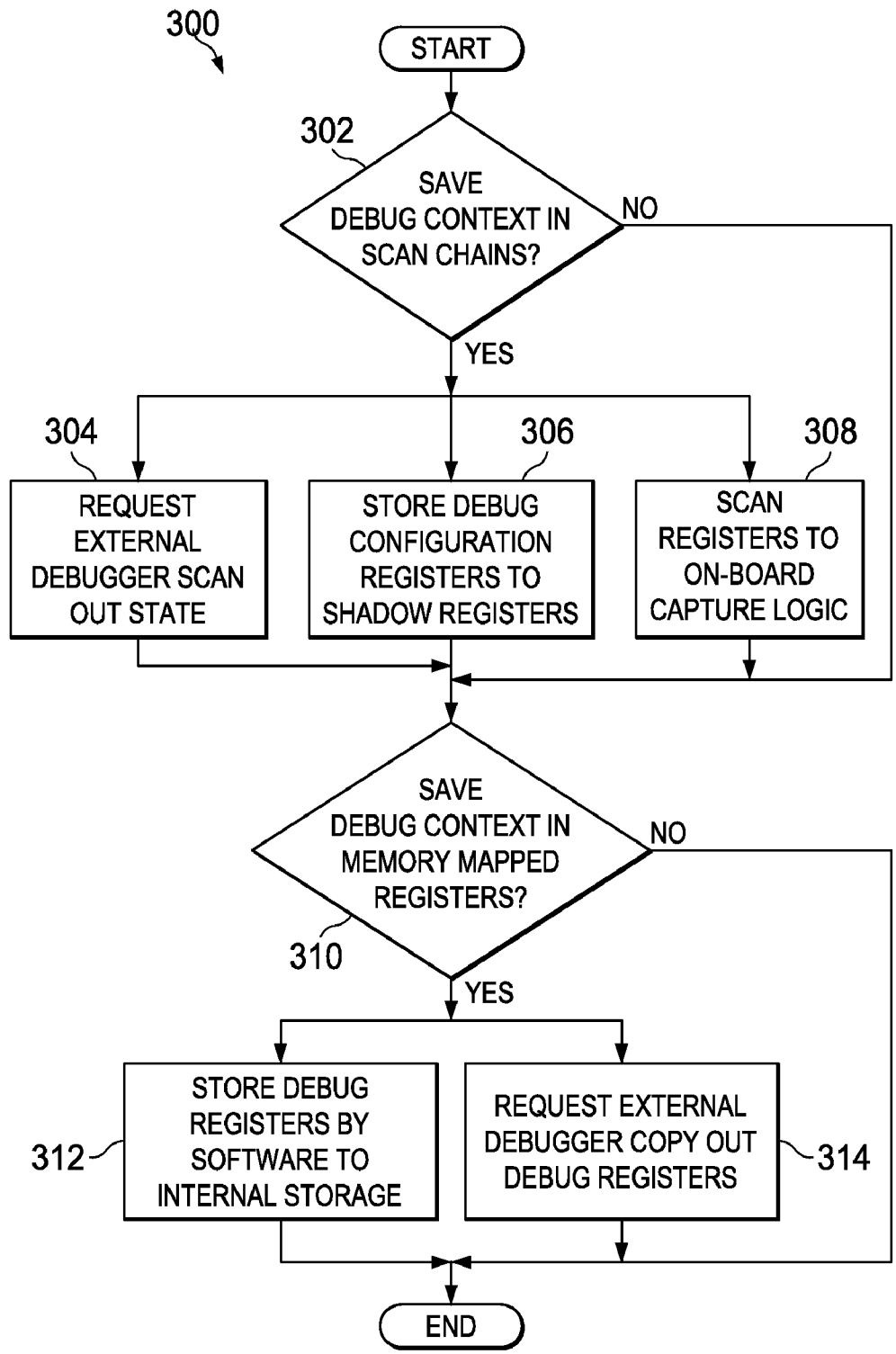
FIG. 3 shows a flow diagram of a method for storing debug context information, in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. A Built-In Self-Test, or BIST, is a well-known test commonly performed on a processor. When a BIST driver is described as being executed, it is understood that the BIST driver drives the BIST hardware to perform/execute the BIST itself.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Disclosed herein is a technique that facilitates the resumption of the debugging process after a processor test, such as a BIST, is performed. The technique includes determining whether a processor test is required. If the test is required, the technique comprises saving the current debug context, executing the test, resetting the processor, re-synchronizing the processor with the debugger, and restoring the debug context.

FIG. 1 shows an illustrative block diagram of a system 100 implementing the technique disclosed herein, in accordance with embodiments. The system 100 may comprise any suitable electronic system, such as an automobile, a mobile communication device, a desktop or notebook computer, a server, a media device, etc. The system 100 includes a debugger 102 and a system-under-test (SUT) 106. The debugger 102 comprises storage 104, while the SUT 106 comprises a central processing unit (CPU) 108 and storage 110. In turn, the CPU 108 comprises debug logic 112 and the storage 110 comprises software 114, an initialization function 116, and one or more registers 120. The SUT 106 further comprises BIST hardware 124 (also known as "BIST logic"), and the storage 110 comprises BIST software 118 (e.g., driver software that drives the BIST hardware 124). The system 100 may comprise additional components, as desired.

The debugger 102 debugs the SUT 106 by transferring and receiving data along connection 122. The connection 122 may use a protocol such as the Joint Test Action Group (JTAG) protocol. The debug logic 112 stored in the CPU 108 comprises logic that is used in concert with the debugger 102 to debug the SUT 106. The CPU 108 is used to execute software stored on storage 110. In particular, CPU 108 executes the software 114, which is used to trigger execution of the BIST driver 118 and, by extension, use of the BIST hardware 124 to perform a BIST. As previously mentioned, the BIST driver 118 comprises software used to drive the BIST hardware 124, so the CPU 108 executes the BIST driver 118 in order to cause the BIST hardware 124 to test the CPU 108. The CPU 108 also executes the initialization function 116, which is used to initialize the CPU 108 after a reset. The CPU 108 also is able to read from and write to registers 120. The registers 120 may store any suitable information (e.g., flags).

FIG. 2 contains a flow diagram of a method 200 performed by the system 100 in accordance with embodiments. Method 200 begins with the CPU 108 determining whether a processor test is required (block 202). A processor test, such as a BIST, may be required for any of a variety of reasons. For example, compliance with a functional safety standard may require a periodic CPU test (e.g., every hour of operation). If such a test is not required, control of the process returns to block 202. However, if such a test is required or is at least deemed to be appropriate, the method 200 proceeds by saving the debug context (block 204). The debug context may include various information, such as processor instruction breakpoints, processor data watchpoints, internal debug triggering information, etc. In at least some embodiments, the debug context may be stored in storage 110, and in particular, in one or more registers 120. In other embodiments, the debug context may be stored in the debug logic 112.

The debug context may be saved in multiple ways. For example, in some embodiments, the CPU 108 may transfer a message, interrupt or other signal to the debugger 102 via connection 122, causing the debugger 102 to respond by scanning out (i.e., reading) the debug context from the SUT 106. The debugger 102 may subsequently "disconnect" itself from the SUT 106 by ceasing communications with the SUT 106 until the test has been executed. Alternatively, in some embodiments, the CPU 108 may store the debug context in non-volatile memory on the SUT 106. The CPU 108 also may store the debug context in other locations, as long as the debug context survives a reset of the CPU 108 and/or the SUT 106 and is available after the reset for retrieval and restoration to the SUT 106. Saving of the debug context is described in further detail below with reference to FIG. 3.

The method 200 subsequently comprises performing the processor test (block 206), such as a BIST. In at least some embodiments, the processor test is executed when the CPU 106 executes the BIST driver 118 which, in turn, drives the BIST hardware 124. Other techniques for testing the processor also may be used. Execution of the processor test may be initiated in various ways. In some embodiments, the CPU 108 executes software 114, which triggers execution of the BIST driver 118. After the BIST driver 118 is executed and the processor test is complete, the software 114 and/or the BIST driver 118 causes the CPU 108 to be reset. In some embodiments, the CPU 108 begins execution of the BIST driver 118 (and the testing using BIST hardware 124) after the CPU 108 is reset. In these embodiments, a flag (e.g., a bit in one of the registers 120) may be set prior to resetting the CPU 108, thereby indicating to the CPU 108 after reset that the reset occurred due to the need to execute the BIST driver 118 and the BIST itself. Thus, upon reset, the CPU 108 detects that the flag is set and, as a result, executes the BIST driver 118 which causes the BIST to be performed. In at least some embodiments, the initialization function 116 may be executed after the reset to cause the CPU 108 to detect the flag and execute the BIST driver 118.

The method 200 further comprises resetting the CPU 106 after the test of block 206 is complete (block 208). This step is present because the techniques disclosed herein are advantageous in at least those situations in which a reset is necessary after performing a processor test. As explained above, execution of the BIST driver 118 may be performed either before or after reset, as desired.

The method 200 still further comprises re-synchronizing the debugger 102 and the SUT 106 (block 210). This re-synchronization may be performed in various ways. In at least some embodiments, re-synchronization may be achieved with the debugger 102 polling the CPU 108 status until the CPU 108 is re-initialized after reset and can respond with a "valid status" signal. Specifically, the connection 122 includes a status signal from the CPU 108 to the debugger 102 that indicates the status of the CPU 108. If the CPU 108 is in a valid state, meaning that it can perform its normal duties and that it is not inactive or otherwise in an initialization mode, the status signal carries a "valid" indication. In contrast, if the CPU 108 is in an invalid state, meaning that it is either inactive or is in an initialization mode, the status signal carries a "not valid" indication, or in some embodiments, carries no indication at all. In accordance with embodiments, the debugger 102 waits after reset of the CPU 108/SUT 106 until the "not valid" indication changes to a "valid" indication, meaning that the CPU 108 is ready to be re-synchronized with the debugger 102. The debugger 102 subsequently trades signals (e.g., in accordance with JTAG protocol) with the CPU 108 to re-establish a functional debugging connection therebetween.

Techniques for re-synchronization other than polling also may be used. For example, in some embodiments, the debug logic 112, which is not reset when the CPU 108 itself is reset, is provided an interrupt signal by the CPU 108 when the CPU 108 executes the initialization function 116 after reset. This interrupt signal causes the debug logic 112 to transfer a signal to the debugger 102 that requests the debugger 102 to re-connect with the CPU 108 (using, for example, JTAG protocols). Other techniques for re-synchronization also may be possible.

The method 200 still further comprises restoring the debug context to the SUT 106 (block 212). Debug context restoration includes the transfer of debug context from the debugger 102 to the context's original storage location on the SUT 106 (e.g., the storage 110 or, more particularly, registers 120). In some embodiments, the CPU 108 may first cause itself to re-enter a debug state after execution of the BIST driver 118/BIST hardware 124 and reset. In other embodiments, the debugger 102 may connect to the CPU 108 and manually cause the CPU 108 to enter the debug state.

Regardless of the technique by which the CPU 108 re-enters a debug state, after the CPU 108 re-enters the debug state, the debug context is restored to the SUT 106. How the debug context is restored to the SUT 106 depends on how the debug context was saved from the SUT 106 in step 204 above. If the debug context was scanned out (e.g., using JTAG protocol) to storage 104 on debugger 102, the debugger 102 reads the debug context from the storage 104 and provides the debug context to the SUT 106 via connection 122 (e.g., again using JTAG protocol). However, if the debug context was merely stored locally on the SUT 106 (for example, on storage 110 or non-volatile storage elsewhere in the SUT 106), the CPU 108 may cause the debug context to be read from the non-volatile storage and written to the debug context's original location (e.g., one or more of the registers 120).

Referring briefly to FIG. 3, a method 300 is shown that describes how the debug context may be saved in some embodiments. The method 300 begins in block 302, in which it is determined whether debug context information is to be stored in scan-chain-based registers. If so, the method 300 provides three different techniques by which such debug context information may be stored. In one instance, the method 300 comprises the generation of a CPU request for the external debugger to save the scan-chain-based context (block 304). Alternatively, or in addition, the method 300 comprises copying the scan-chain-based context to internal shadow registers that are not scrambled by BIST testing or subsequent reset (block 306). Alternatively, or in addition, the method 300 comprises implementing an internal scan-chain-based engine which can scan the debug context scan-chain to internal storage without using or needing external debugger hardware (block 308). In block 310, it is determined whether debug context data is to be stored in CPU-accessible memory-mapped registers. Two different techniques are shown which enable this storage to be accomplished. In block 312, a CPU stores the memory-mapped context to internal storage which is not affected by the BIST testing. Alternatively, or in addition, the method 300 comprises requesting an external debugger to copy out the contents of debug registers (block 314). The method 300 may be modified as desired.

Figure 4:
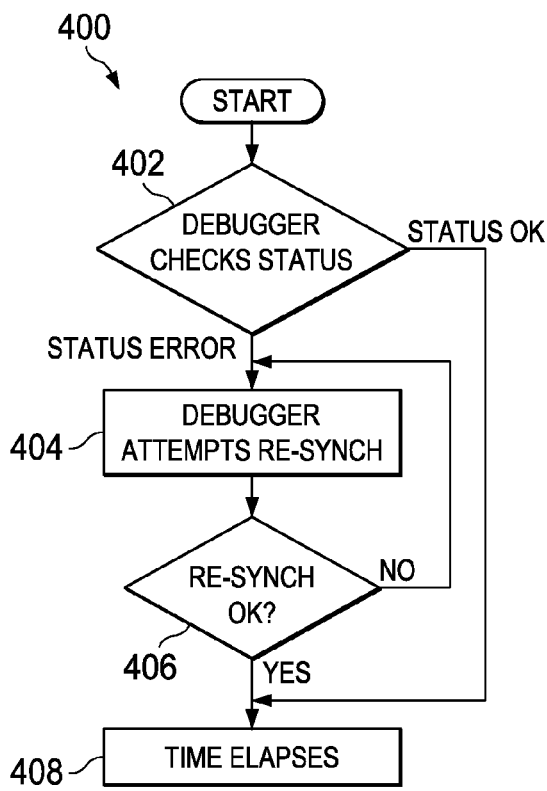
FIG. 4 shows a flow diagram of a method for re-synchronizing a debugger with a system under test (SUT), in accordance with embodiments.

FIG. 4 shows an illustrative method 400 usable to perform the polling function described above in reference to re-synchronization step 210. The method 400 begins with the debugger 102 checking the status signal received from the CPU 108 (block 402). If the status signal indicates that the CPU 108 is in an active state, the polling process is complete (block 408). However, if the status signal indicates that the CPU 108 is not in an active state, the method 400 comprises the debugger 102 attempting to re-synchronize with the CPU 108 (block 404). The method 400 then comprises determining whether the re-synchronization attempt was successful (block 406). If not, control of the method 400 is provided to block 404. Otherwise, the polling process is complete (block 408). The method 400 may be modified as desired.

Figure 5:
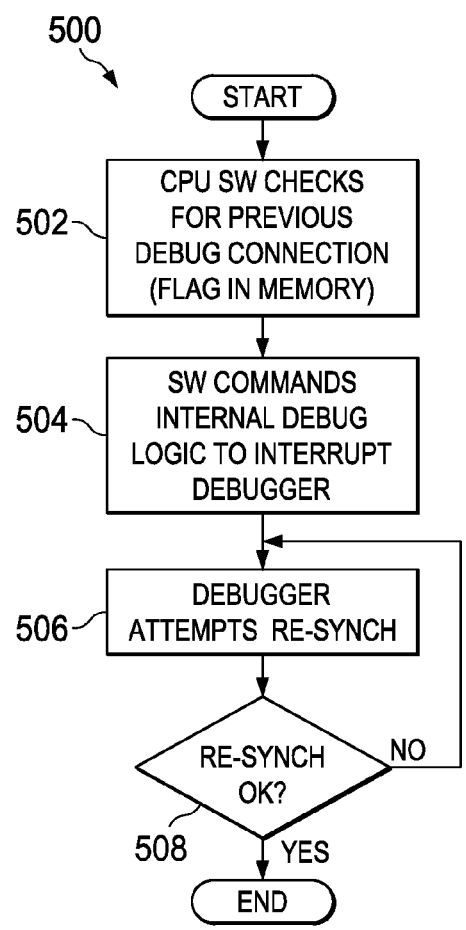
FIG. 5 shows a flow diagram of another method for re-synchronizing a debugger with a SUT, in accordance with embodiments.

FIG. 5 shows an illustrative method 500 usable to perform the interrupt-based function (in lieu of the polling function) described above in reference to re-synchronization step 210. The method 500 begins with the CPU 108 checking the flag, mentioned above, in the registers 120 that indicates that a debug session was occurring prior to testing and reset of the CPU 108 (block 502). The CPU 108 assesses the status of the flag and determines that the debug session indeed was occurring in this manner (block 502). In turn, the debug logic 112 issues an interrupt request to the debugger 102 (block 504). As a result of this interrupt request, the debugger 102 attempts to re-synchronize with the CPU 108, as previously described (block 506). The method 500 then comprises determining whether the re-synchronization was successful (block 508). If not, control of the method 500 returns to block 506. Otherwise, method 500 is complete. The method 500 may be modified as desired.

Figure 6:
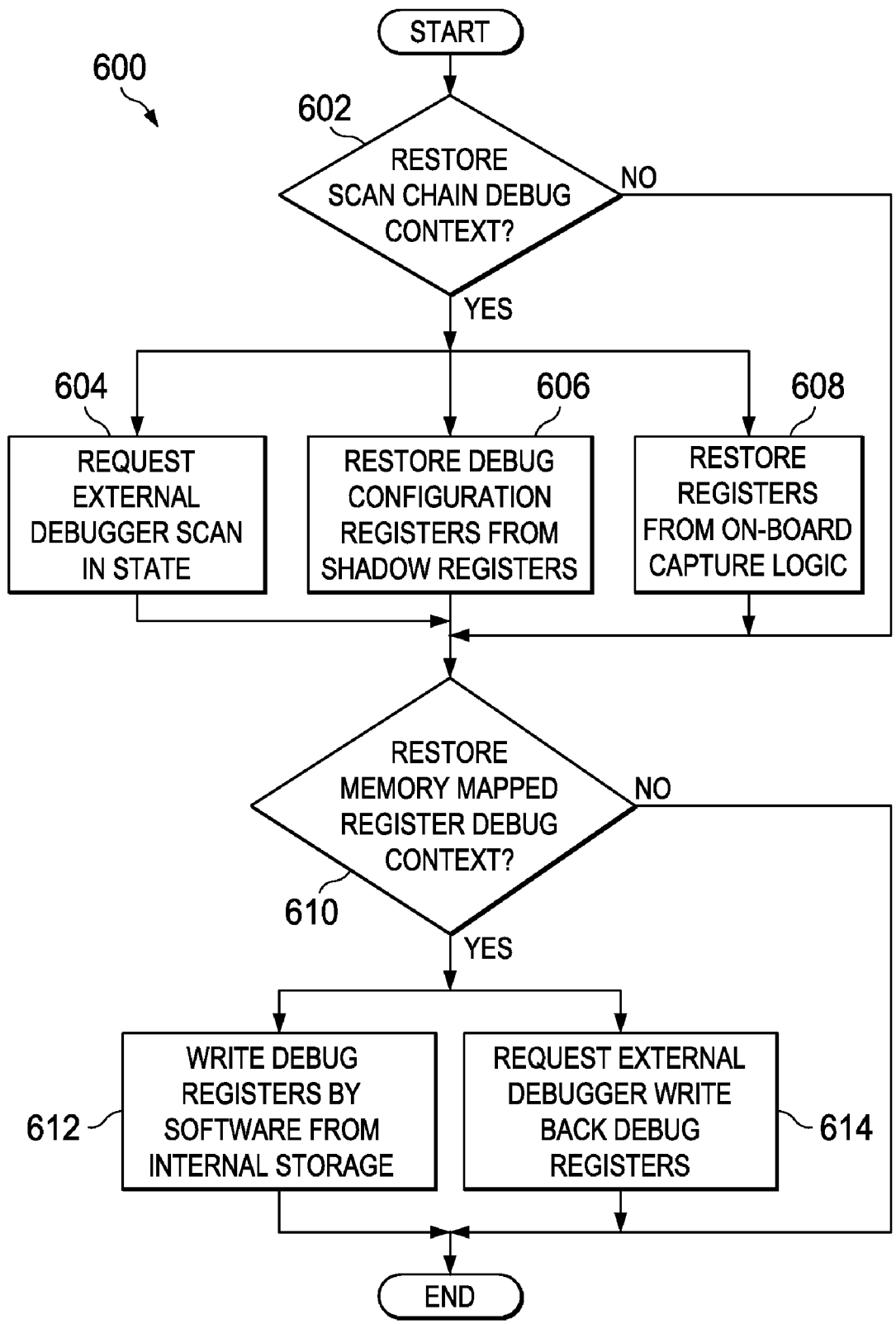
FIG. 6 shows a flow diagram of a method for restoring debug context information, in accordance with embodiments.

FIG. 6 shows an illustrative method 600 usable to restore the debug context to the SUT 106 after testing and restarting the CPU 108 and/or the SUT 106. The method 600 is essentially an inverted form of the method 300. The method 600 begins by determining whether debug context information stored in scan chains is to be restored (block 602). If so, at least three options are available. The method 600 comprises restoring the context from the external debugger back to the SUT (block 604), restoring debug context information previously copied to shadow registers by reading the information out of the shadow registers (block 606), and/or restoring debug context information from internal storage (stored as described in block 308 of FIG. 3) (block 608). The method 600 comprises determining whether debug context information stored in memory-mapped registers is to be restored (block 610). The method 600 comprises restoring the debug context from the internal storage (the reverse of the storage described in block 312 of FIG. 3) (block 612) and/or restoring the debug context from the external debugger (block 614). The method 600 may be modified as desired.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system under test (SUT) that executes a built-in self-test (BIST) during an SUT-debug session without losing debug context information associated with said debug session;
   wherein the SUT comprises processing logic that stores the debug context information to storage external to the SUT prior to causing execution of said BIST;
   wherein, after causing execution of said BIST, the processing logic re-synchronizes with a debugger external to the SUT and resumes a debugging session that was interrupted by execution of the BIST.

2. The system of claim 1, wherein, after causing execution of said BIST, the processing logic restores said debug context information from the external storage to the SUT.

* * * * *